United States Patent
Avivi et al.

(10) Patent No.: US 10,873,333 B2
(45) Date of Patent: Dec. 22, 2020

(54) SPUR FREQUENCY ESTIMATION INSIDE DIGITAL PHASE LOCKED LOOP

(71) Applicant: Intel Corporation, Santa Clara, CA (US)

(72) Inventors: Rotem Avivi, Petah-Tiqwa (IL); Michael Kerner, Tel Mond (IL); Yair Dgani, Raanana (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/609,280

(22) PCT Filed: May 31, 2017

(86) PCT No.: PCT/US2017/035096
§ 371 (c)(1),
(2) Date: Oct. 29, 2019

(87) PCT Pub. No.: WO2018/222176
PCT Pub. Date: Dec. 6, 2018

(65) Prior Publication Data
US 2020/0195258 A1 Jun. 18, 2020

(51) Int. Cl.
*H03L 7/093* (2006.01)
(52) U.S. Cl.
CPC .......... *H03L 7/093* (2013.01); *H03L 2207/50* (2013.01)
(58) Field of Classification Search
CPC ......... H03L 7/093; H03L 7/08; G04F 10/005; H03M 1/0836
See application file for complete search history.

(56) References Cited

U.S. PATENT DOCUMENTS

| | | | |
|---|---|---|---|
| 8,019,034 B2* | 9/2011 | Hutchins | G11B 20/10037 375/371 |
| 8,451,918 B1 | 5/2013 | Cheng et al. | |
| 9,762,250 B2* | 9/2017 | Perrott | H03M 1/66 |
| 10,284,332 B2* | 5/2019 | Avivi | H04B 1/40 |
| 10,608,647 B1* | 3/2020 | Ranganathan | H03L 7/1972 |
| 2008/0177490 A1 | 7/2008 | Feldhaus et al. | |
| 2010/0039182 A1* | 2/2010 | Galton | H03L 7/0898 331/1 A |
| 2011/0228838 A1* | 9/2011 | Yang | H04L 27/2657 375/232 |

(Continued)

FOREIGN PATENT DOCUMENTS

WO    2016/060865 A1    4/2016

OTHER PUBLICATIONS

International Search Report dated Oct. 9, 2017 for International Application No. PCT/US2017/035096.

(Continued)

*Primary Examiner* — Adam D Houston
(74) *Attorney, Agent, or Firm* — 2SPL Patent Attorneys PartG mbB; Yong Beom Hwang

(57) ABSTRACT

Systems and methods configured to cancel spurs in a phase locked loop (PLL) system are provided. A method configured to cancel spurs in a PLL system includes receiving a PLL signal from the PLL system; determining an estimated spur frequency of a spur in the received PLL signal based on the received PLL signal; and canceling the spur in the received PLL signal based on the estimated spur frequency.

22 Claims, 3 Drawing Sheets

(56) References Cited

U.S. PATENT DOCUMENTS

| | | | |
|---|---|---|---|
| 2014/0140440 A1 | 5/2014 | Sun et al. | |
| 2015/0145567 A1* | 5/2015 | Perrott | G04F 10/005 |
| | | | 327/156 |
| 2015/0145571 A1* | 5/2015 | Perrott | H03L 7/093 |
| | | | 327/159 |
| 2016/0079991 A1* | 3/2016 | Pelissier | G06F 30/30 |
| | | | 327/158 |
| 2016/0359493 A1 | 12/2016 | Chen et al. | |
| 2018/0038943 A1* | 2/2018 | Ramasubramanian | |
| | | | G01S 7/352 |
| 2019/0375417 A1* | 12/2019 | Godet | G01S 11/10 |

OTHER PUBLICATIONS

Santamari, Ignacio et al. "A Comparative Study of High-Accuracy Frequency Estimation Methods." Mechanical Systems and Signal Processing (2000) 14(5), 819-834.

International Preliminary Report on Patentability dated Dec. 3, 2019 for International Application No. PCT/US2017/035096.

* cited by examiner

SPUR FREQUENCY ESTIMATION INSIDE DIGITAL PHASE LOCKED LOOP

This application is a National Phase entry application of International Patent Application No. PCT/US2017/035096 filed May 31, 2017, entitled 'SPUR FREQUENCY ESTIMATION INSIDE DIGITAL PHASE LOCKED LOOP" in the name of Rotem Avivi et al. and is hereby incorporated by reference in its entirety.

FIELD

The present disclosure relates to the field of wireless communications such as 3GPP, 4G, LTE, and 5G and wireless local area network (WLAN) communication systems for standards such as WiFi, 802.11ac, 802.11ax, and in particular to methods and apparatus for reducing the impact of spurs in phase locked loops (PLLs) in these systems.

BACKGROUND

Phase locked loops (PLLs) are used widely in communication systems for frequency synthesis, synchronization of carrier and clock and data recovery, radar systems, clock trees in high speed microprocessors and digital systems tone decoders, video signals and many other applications. PLLs are often used in digital signal processing systems in the form of digital phase locked loops (DPLLs). One main applications of PLLs in modern communication devices is in frequency synthesizers that perform frequency generation. Frequency generation is an important function performed in both transmitters and receivers for accurate frequency conversion of baseband and RF signals.

Spurs are unintended signals that may degrade the performance of the frequency synthesizer and thus the device. For example, in the transmitter, the frequency synthesizer must often be designed to handle low spurious emissions for spectral mask containment and also to maintain proper symbol construction to reduce the error vector magnitude (EVM). For receivers, frequency synthesizers must also exhibit low spurious generation to down convert the desired signal while avoiding effects such as reciprocal mixing and also to maintain an acceptable signal to noise ratio. Low spurious outputs are also important in carrier and data recovery circuits in which the signal to noise ratio of the recovered carrier is important. Embodiments described herein pertain to a method of controlling spurious outputs in a digital PLL.

BRIEF DESCRIPTION OF THE DRAWINGS

Some examples of circuits, apparatuses and/or methods will be described in the following by way of example only. In this context, reference will be made to the accompanying figures.

DETAILED DESCRIPTION

Figure 1:
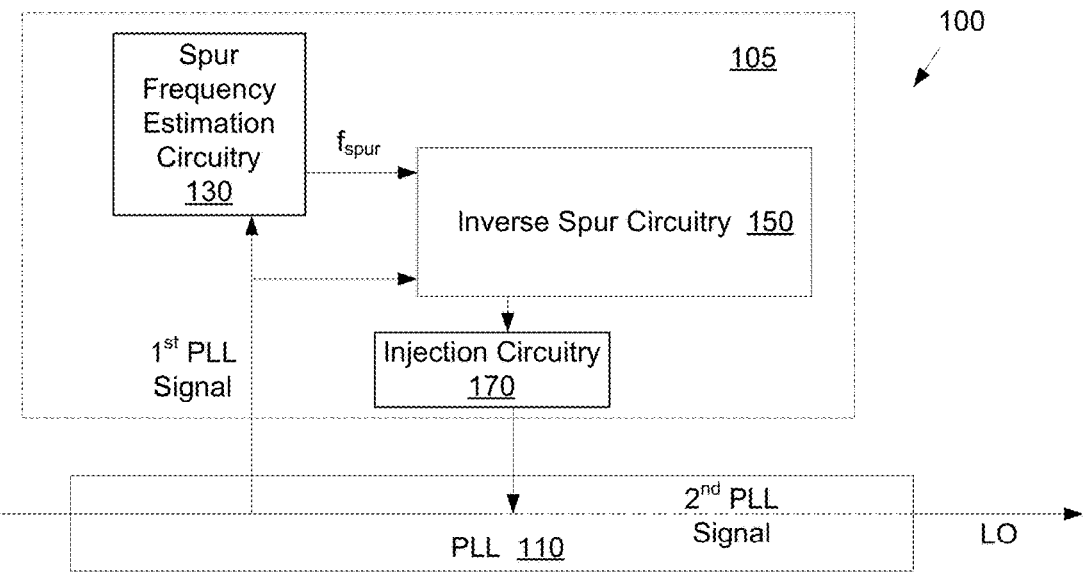
FIG. 1 illustrates an exemplary PLL architecture that includes a frequency generation system with a spur frequency estimation circuitry that determines an estimated spur frequency.

One of the most common sources of spurs in a receiver or transmitter system is in the PLL subsystem. Spurs may be generated in a PLL subsystem by a divider circuit or a fractional divider circuit. Spurs may also be generated in the VCO or numerically controlled oscillator (NCO), the phase detector, and/or time to digital converter (TDC). Input spurs already on the reference signal (known as reference spurs) can also cause PLL spur. Spurs can be injected into the PLL system from the power supply. These are more common when the electronic device employs a DC to DC converter which requires a switcher that often produces spurs on the power supply lines. Often spurs are created by some mechanism in the PLL which causes a slight over correction or under correction occurring in a periodic fashion. With digital systems and digital PLLs, spurs are also caused by quantization effects and round off errors.

Various methods already exist for mitigating spurs such as increasing the resolution of the devices or adding dithering signals to break up the periodicity. However increasing the resolution of digital devices requires more power and chip area and does not always affect the spur. The dithering technique is only applicable in certain situations and quite often does not reduce the spur either. Further, dithering is effectively injecting pseudorandom noise into the loop to break up the periodicity and consequently any spur reduction comes at the price of increasing the noise floor. Other attempts have included notch filters in the transmit or receive chain which are difficult to implement requiring a high degree of selectivity. Also the notch filters are not very easily tuned to different frequencies which is necessary if the operating conditions of the synthesizer change.

Some spur cancelation systems mitigate or cancel spurs in a PLL by injecting an externally generated correction term (called an "inverse spur signal") to a PLL. The inverse spur signal is created with the same magnitude, phase and frequency as the undesirable spur which exists in the PLL. The inverse spur signal is determined such that the resulting sum (spur in the PLL signal+the inverse spur signal) will go zero. If the inverse spur has the correct magnitude, frequency, and phase, then when injected into the loop, the undesired spur is cancelled. The inverse spur signal is determined to have the same gain and phase as the expected spur (or, alternatively, the same gain and inverse phase of the expected spur). These spur cancelation techniques utilize a preprogrammed "expected" spur frequency that is selected a priori based, for example, on expected sources of spurs and/or the intended operating frequency of the transmitter/receiver in the device.

While the use of a predetermined expected spur frequency provides adequate spur cancelation in many instances, modern devices present additional challenges to selecting a preprogrammed spur frequency at design time. For example, in 802.11ax standard the client (STA) is required to perform Sampling Frequency Offset (SFO) and Center Frequency Offset (CFO) correction on trigger based frames (Multi-User-OFDMA-UL) relative to the trigger frame, in order to minimize the ICI and inter user interference. This CFO frequency correction is usually done by re-tuning the device's DPLL. After this re-tuning operation the spur frequency location might move to a new location, and unless the change in spur frequency location is accounted for the spur cancelation system, spurs may not be effectively canceled.

Described herein are systems, methods, and circuitries that estimate a spur frequency for a spur in the PLL based on a signal from the PLL. In this manner, the spur frequency can be estimated directly from a signal, such as a phase error signal, received from the PLL or DPLL. In some cases, this can improve the accuracy of spur cancelation systems that rely on an expected spur frequency to generate an inverse spur signal. In other cases, like 802.11ax trigger based frames, this enables the spur cancelation system to continue to cancel spurs as though the spur frequency is known a priori.

The present disclosure will now be described with reference to the attached figures, wherein like reference numerals are used to refer to like elements throughout, and wherein the illustrated structures and devices are not necessarily drawn to scale. As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute software and/or firmware that confer(s), at least in part, the functionality of the electronic components.

It will be understood that when an element is referred to as being "electrically connected" or "electrically coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being electrically coupled or connected to one another. Further, when electrically coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

Figure 2:
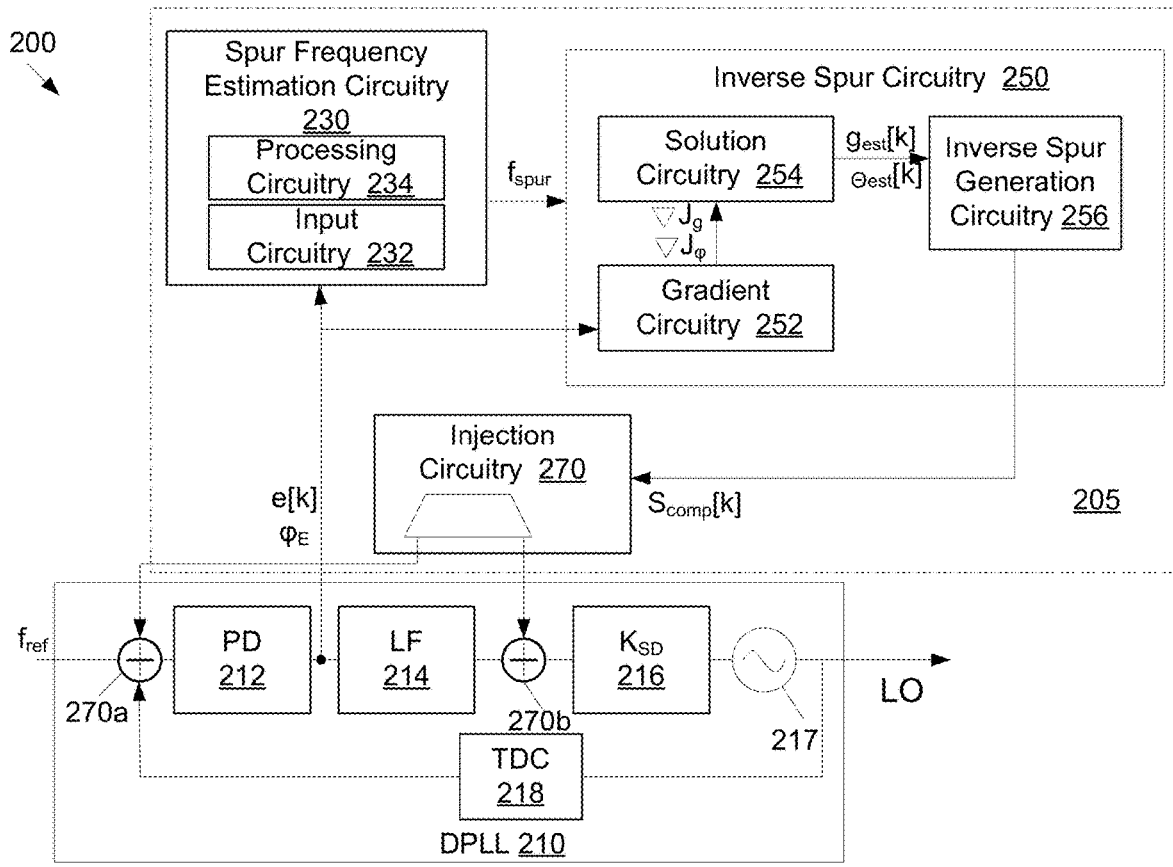
FIG. 2 illustrates another exemplary DPLL architecture that includes a frequency generation system with a spur frequency estimation circuitry that determines an estimated spur frequency.

FIG. 1 illustrates an exemplary frequency generation system 100 or that includes a spur cancelation system 105. The frequency generation system 100 includes a PLL 110 that is used to generate an LO signal having a desired frequency for use by the transmitter and receiver chains (not shown). For the purposes of this description, the "PLL" is a set or series of electronic components that process, manipulate, or otherwise act upon a reference clock signal as the signal flows through the chain of electronic components. One example of a set of electronic components that make up a DPLL is illustrated in FIG. 2.

Due to the operation of the components within the PLL 110, the signal being processed by the PLL will itself be modified and will differ in some aspects at various points in the chain. However, for the purposes of this description, the term "PLL (or DPLL) signal" when used in reference to a signal flowing through a PLL or DPLL may refer to the signal in any form at any stage of alteration and is not limited to the signal any particular point in the DPLL. For example, when a reference clock signal and a feedback LO signal are processed by a phase detector to generate a phase error signal and the phase error signal is processed by a lowpass filter to generate a filtered signal, both phase error signal and the filtered signal may be both referred to as a "PLL (or DPLL) signal."

A traditional phase locked loop in its simplest form consists of three elements; a phase detector, a loop filter, and a voltage controlled oscillator (VCO) or digitally controlled oscillator (DCO). The phase detector measures the phase error between a reference signal and the VCO/DCO output. The phase error (the phase detector output) which changes due to variation in the reference and due to noise is smoothed out or averaged by the loop filter. The average phase error (the output of the loop filter) is used to steer the VCO/DCO in a negative feedback loop so as to drive the average phase error to zero or as close to zero as the particular PLL architecture is capable of.

The spur cancelation system 105 includes spur frequency estimation circuitry 130 and inverse spur circuitry 150. The spur frequency estimation circuitry 130 is configured to receive a phase locked loop (PLL) signal from the PLL 110 and determine an estimated spur frequency ($f_{spur}$) of a spur in the PLL signal based on the received PLL signal. The estimated spur frequency is provided to the inverse spur circuitry 150.

The inverse spur circuitry 150 is configured to generate an inverse spur signal based on the estimated spur frequency. The inverse spur signal has a phase and gain that matches the phase and gain of a spur in the received PLL signal. The inverse spur signal is described herein as a digital signal because it may be advantageous to perform the computations to generate the inverse spur signal with digital components. However an inverse spur signal may be generated using any appropriate components, including analog circuitry.

The injection circuitry 170 is configured to inject or combine the inverse spur signal with a second PLL signal. In the described system, the inverse spur signal and the second signal are both digital signals. However, the inverse spur signal may be converted to an analog signal by a digital to analog converter (DAC) (not shown) in the injection circuitry 170 prior to being injected into an analog PLL. It can be seen that in the spur cancelation system 105, the spur frequency is estimated based on a first PLL signal received from the PLL and as such the inverse spur signal reflects the actual operating conditions of the architecture 100 and the inverse spur signal will change as the first PLL signal changes.

FIG. 2 illustrates an example DPLL system 200 that includes a spur cancelation system 205 and a DPLL 210. The operation of the DPLL 210 is analogous to that described above. A reference signal $f_{ref}$ and an output of a voltage controlled oscillator (VCO) 217 are compared by a time to digital converter (TDC) 218. The TDC 218 measures the time between a rising edge of the reference signal $f_{ref}$ and the VCO output and produces a digital word representing the measured time which is similar to a phase difference. This measured time (phase difference) is added to the $f_{ref}$ signal and input to a phase detector 212 that determines a phase error between the phase of the feedback LO signal and the phase of the $f_{ref}$ signal. A digital lowpass filter (LPF) 214 smooths out abrupt transitions in the phase error. The smoothed phase error is scaled by a scaler 216 and used to drive the VCO 217 to generate the LO signal. In the locked condition the DPLL loop drives the phase error to zero.

As described with reference to FIG. 1, the spur cancelation system 205 includes frequency estimation circuitry 230 that includes input circuitry 232 and processing circuitry 234. The input circuitry 232 receives a DPLL signal. In the example illustrated in FIG. 2, the DPLL signal received by the input circuitry 232 is a phase error signal that is generated by the phase detector 212. The frequency estimation circuitry 230 is activated before activation of an inverse spur circuitry 250. The frequency estimation circuitry 230 includes processing circuitry 234 that estimates the frequency of the spur(s) in the phase error signal.

The processing circuitry 234 may determine the estimated spur frequency using any appropriate technique. In general spur frequencies may be determined by Fourier Transform (FT) based techniques that detect peaks in a window of a signal or by parametric algorithms or techniques that are based on autocorrelation analysis of some number of samples of a signal. While parametric techniques may be more accurate, due to their relatively high processing overhead, the FT based techniques may be more suitable for use in portable communication devices. The remainder of the description will be given in the context of an FT based frequency estimation, however it is emphasized that the function of the processing circuitry 234 is not to be limited to any particular technique.

Figure 2A:
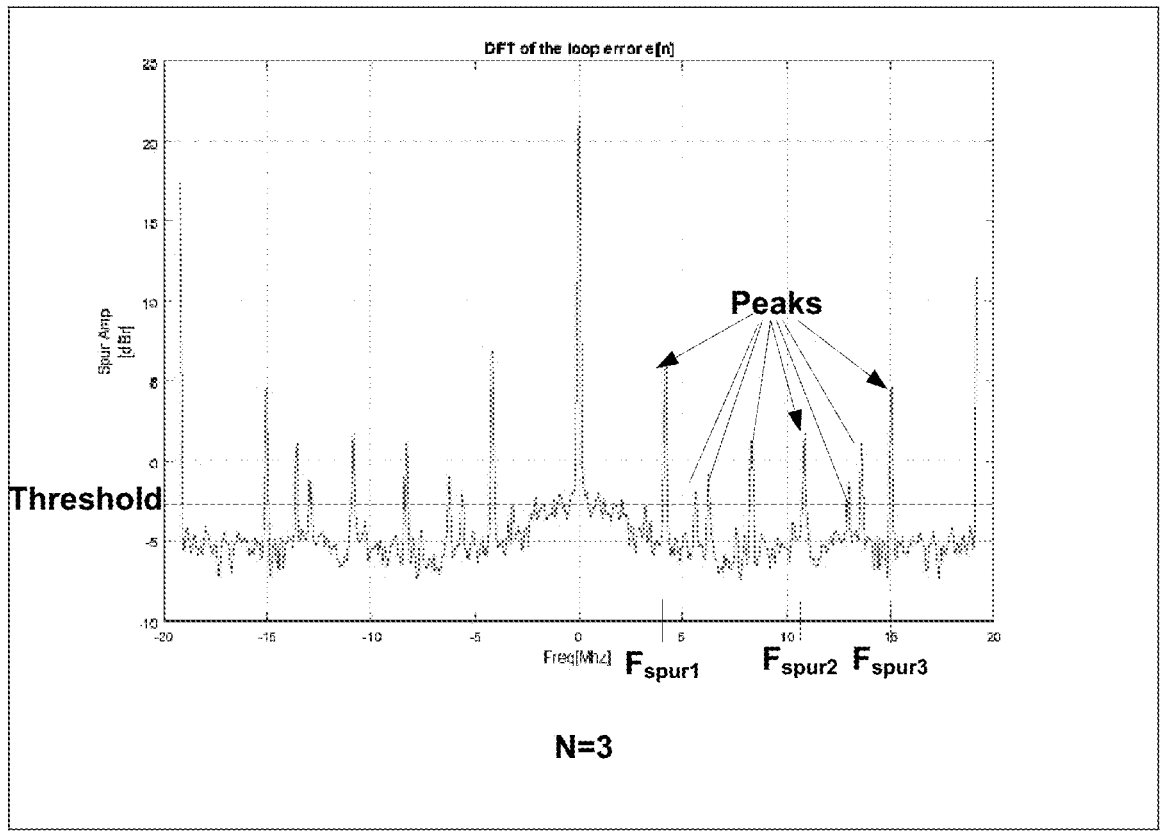
FIG. 2A depicts a digital fast Fourier transform (DFT) of a phase error signal to illustrate analysis performed by an example processing circuitry in the spur frequency estimation circuitry of FIG. 2.

As an example, under the assumption that the dominant part of the noise comes from the crystal, it can be assumed that the noise (e.g., spur) is additive, white and Gaussian (AWGN). The maximum likelihood (ML) estimator is given by the location of a peak of a DFT picture in the frequency domain. FIG. 2A illustrates a DFT picture of the phase error e[k]. The processing circuitry 234 identifies the "peaks" in the DFT picture (all the "peaks" that cross some pre-defined "noise" threshold). The processing circuitry 234 then determines the frequency location of these "peak(s.)" The processing circuitry 234 calculates the location of these "peak (s)" as corresponding $f_{spur}(S)$. The $f_{spur}(S)$ are provided to the inverse spur circuitry 250 which uses $f_{spur}$ to cancel spurs in the DPLL 210. The processing circuitry 234 may include a dedicated processor or firmware, or be implemented as a function of a multi-purpose processor (see processor 402 in FIG. 4).

In this example, the DC peak is ignored and due to the symmetry of the spurs, only spurs having a "positive" frequency are considered. A number N is preselected to identify a number of spurs to be canceled. In FIG. 2A, N is 3 and eight peaks are identified. Thus, in the example of FIG. 2A, the frequencies of the three highest peaks $f_{spur1}$, $f_{spur2}$, and $f_{spur3}$ will be provided to the inverse spur circuitry 250. However, the processing circuitry 234 may select any number of peaks based on any given criteria.

One particular example of inverse spur circuitry 250 and injection circuitry 270 will now be described. However, it is emphasized that the function of the inverse spur circuitry 250 and injection circuitry 270 is not to be limited to any particular technique for generating the inverse spur signal $S_{comp}[k]$ using the estimated spur frequency.

The injection circuitry includes two different adder elements 270a, 270b. The first adder element 270a is disposed at an input to the phase detector 212. The second adder element 270b is disposed at an input to the scaler 216. In this manner, the inverse spur signal can be injected at the input of the VCO 217 or at the output of the TDC 218 of the PLL. One difference between these injection points is that one is in front of the phase detector and the other is after the loop filter. The transfer function from each injection point to the error signal e[k] are different and the choice depends on the source of the spur and the transfer function. The injection circuitry 270 is configured to, responsive to a selection input, select one of the injection points, and then can switch the injection point depending on the conditions in real time.

In one example, the spur cancelation system 205 can be used to cancel multiple spurs. Here, there may be a separate inverse spur circuitry 250 to create an inverse spur signal for each spur and each injection circuitry 270 may be capable of injecting multiple inverse spur signals at different injection points. Again, depending on the transfer function for each spur, the injection circuitry 270 selects one of the two adder elements 270a, 270b as the injection point for the respective inverse spur signals.

While at t=0, $S_{comp}[k]$ will be 0, after several iterations during which $S_{comp}[k]$ is built from sample to sample, $S_{comp}[k]$ will converge to an inverse spur signal that approximates the unwanted spur in the transmit signal. In this manner, the spur cancelation system finds an "inverse spur" term and injects it with the right phase and gain into the DPLL 210 such that the spur will be canceled out. The inverse spur signal or "inverse sinus" $S_{comp}[k]$ may be added at either of the injection points (e.g., adder elements) 270a or 270b. Thus the correction term is "subtracted" inside the DPLL by the injection circuitry 270 so that error signal e[k] (e.g., phase error) represents the error between the spur and the inverse spur signal.

The inverse spur circuitry 250 includes gradient circuitry 252, solution circuitry 254, and inverse spur generation circuitry 256. The gradient circuitry is configured to compute a gradient of a gain of the error signal (which contains the isolated spur signal) and a gradient of a phase of the error signal. As will be described in more detail below, the described exemplary solution circuitry 254 is configured to use the gradients to derive gain and phase coefficients $g_{est}[k]$ and $\varphi_{est}[k]$. The coefficients are used by the inverse spur generation circuitry 256 to generate the inverse spur signal $S_{comp}[k]$ that, when injected into DPLL, will cancel the spur. For example, the inverse spur generation circuitry 256 may include a numerically controlled oscillator (NCO) that generates a sinus wave based on the gain and the phase expressed by the estimated gain and phase coefficients $g_{est}[k]$ and $\varphi_{est}[k]$.

The spur signal has the general form:

$$g[k] \cdot \sin(2 \cdot \pi \cdot f \cdot n / f_{samp} + \varphi[k]) \quad \text{EQ 1}$$

where g and φ are unknown gain and phase.
The inverse spur signal has the general form:

$$g_{est}[k] \cdot \sin(2 \cdot \pi \cdot f \cdot n / f_{samp} + \varphi_{est}[k]) \quad \text{EQ 2}$$

The solution circuitry 254 finds $g_{est}$ and $\varphi_{est}$ using least mean squares (LMS) or any other adaptive or non-adaptive approach. Ideally, the solution circuitry 254 finds a value of $g_{est}$ that converges to the spur gain and a value of $\varphi_{est}$ that converges to the spur phase plus 180 degrees. In order to find the gain and phase of the spur, the solution circuitry 254 solves a minimization problem in which the spur energy (as represented by the error signal e[k]) is minimized.

The spur residual energy can be represented by:

$$e^2[k] = \left( \begin{array}{l} e\_wo\_spur[k] + g[k] \cdot \sin\left(2 \cdot \pi \cdot f_{spur} \cdot \dfrac{n}{f_{samp}} + \varphi[k]\right) - \\ g_{est}[k] \cdot \sin\left(2 \cdot \pi \cdot f_{spur} \cdot \dfrac{n}{f_{samp}} + \varphi_{est}[k]\right) \end{array} \right)^2 \quad \text{EQ 3}$$

Where $f_{samp}$ is the sampling frequency and $f_{spur}$ is the spur frequency. As just discussed, $g_{est}$ and $\varphi_{est}$ are found by the solution circuitry 254 using a LMS technique (e.g., using two separate LMS for gain and phase) such that the additional terms (caused by the spur and the inverse spur signal) in the square error expression ($e^2[k]$) will be minimized (go to zero) and the spur will be canceled out.

The solution circuitry 254 may find the coefficients as follows. Recall that the goal is to find $g_{est}$ and $\varphi_{est}$ coefficients such that the square error ($e^2[k]$) will be minimized and the spur will be canceled out. The coefficients $g_{est}$ and $\omega_{est}$ are found using LMS technique (two dimensional LMS): $e^2[k]$ is found according to each parameter:

$$g_{gradient}(k) = \quad \text{EQ 4}$$

$$\dfrac{\partial e^2(n)}{\partial g} = 2 \cdot e(k) \cdot g(k) \cdot \sin(2 \cdot \pi \cdot f_{spur} \cdot n / f_{samp} + \varphi_{est}(k-1))$$

Where instead of φ the last phase-LMS $\varphi_{est}(k-1)$ is substituted. Then, the gain-LMS is determined according to:

$$g_{est}(k) = g_{est}(k-1) - \mu_{gain} \cdot g_{gradient}(k) \quad \text{EQ 5}$$

Similarly the phase-LMS is determined according to:

$$\varphi_{gradient}(k) = \quad \text{EQ 6}$$

$$\dfrac{\partial e^2(n)}{\partial \varphi} = 2 \cdot e(k) \cdot g_{est}(k-1) \cdot \cos(2 \cdot \pi \cdot f_{spur} \cdot n / f_{samp} + \varphi_{est}(k-1))$$

Where instead of φ the last phase-LMS $\varphi_{est}(k-1)$ is substituted and instead of the last gain-LMS $g_{est}(k-1)$ is substituted.

Then, the phase-LMS is determined according to:

$$\varphi_{est}(k) = \varphi_{est}(k-1) - \mu_{phi} \cdot \varphi_{gradient}(k)$$

The idea of this approach is that if the square error $e^2(k)$ gradient is positive, it implies that error e(k) would keep increasing positively if the same weight ($g_{est}$) is used for further iterations. This means the weight ($g_{est}$) should be reduced. The same principle holds for the weight $\varphi_{est}(k)$.

While the methods are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Figure 3:
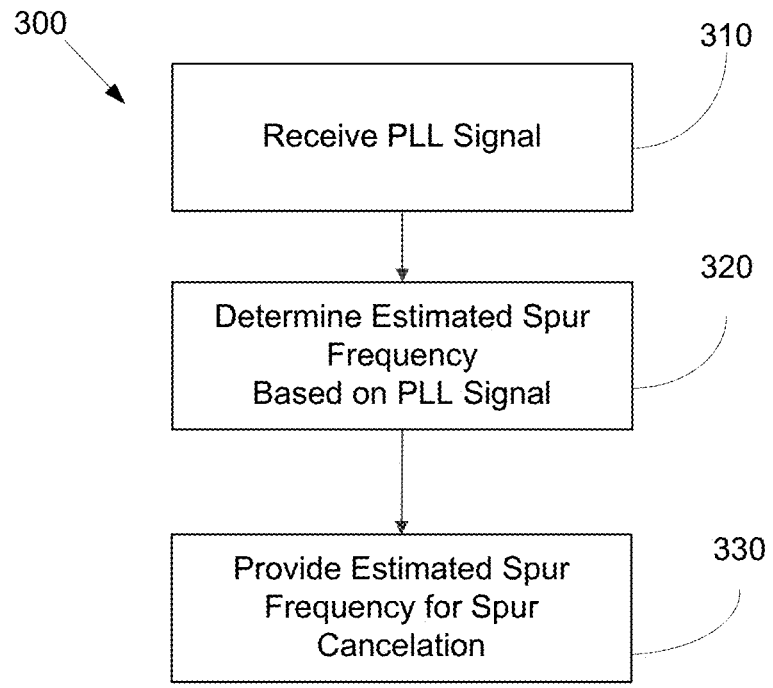
FIG. 3 illustrates a flowchart that outlines an example method for estimating a spur frequency for use in canceling a spur in a PLL.

FIG. 3 depicts a flowchart outlining one embodiment of a method 300 for canceling a spur from a transceiver signal. The method 300 may be performed, for example, by the spur frequency estimation circuitry of FIGS. 1-2. The method includes, at step 310, receiving phase locked loop (PLL) signal from a PLL. An estimated spur frequency of a spur in the received PLL signal is determined based on the received PLL signal at step 320. At step 330, the spur in the received PLL signal is canceled based on the estimated spur frequency by the injection of the inverse spur signal into a second PLL signal.

In one example, the received PLL signal comprises a phase error signal generated by a phase detector in the PLL. In one example, the estimated spur frequency is determined by: analyzing a Fourier transform (FT) of the received PLL signal; determining a frequency at which the FT of the phase error signal exceeds a threshold; and determining the estimated spur frequency as the frequency at which the FT of the phase error signal exceeds the threshold.

It can be seen from the foregoing description that the disclosed systems, devices, and methods provide effective spur cancelation by generating an inverse spur signal that approximates an expected spur and is based on an estimated spur frequency that reflects the present operating conditions of a transceiver. The disclosed systems, devices, and methods may be implemented in the digital domain, increasing performance and minimizing degradation of the wanted signal.

Figure 4:
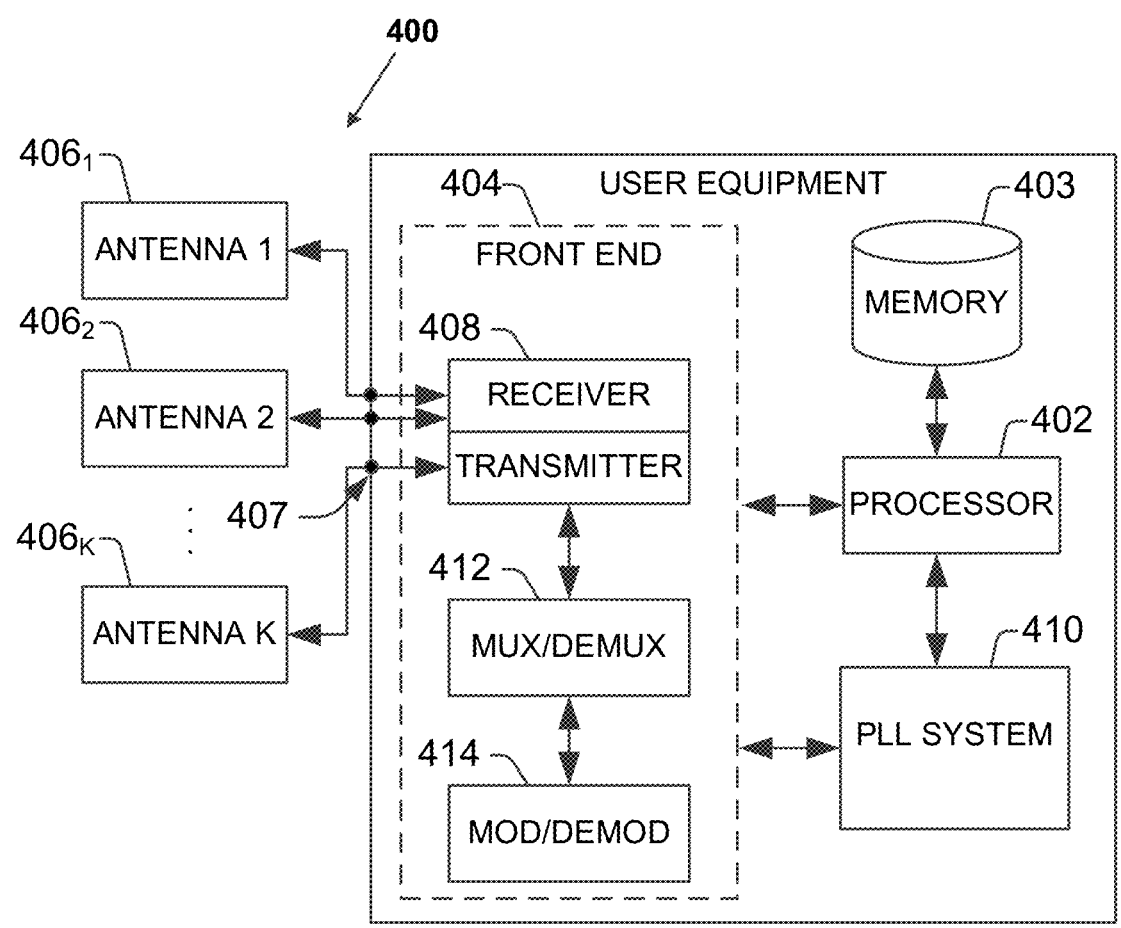
FIG. 4 illustrates an example user equipment device that includes a PLL system that includes an inverse spur system in accordance with various aspects described.

To provide further context for various aspects of the disclosed subject matter, FIG. 4 illustrates a block diagram of an embodiment of user equipment 400 (e.g., a mobile device, communication device, personal digital assistant, etc.) related to access of a network (e.g., base station, wireless access point, femtocell access point, and so forth) that can enable and/or exploit features or aspects of the disclosed aspects.

The user equipment or mobile communication device 400 can be utilized with one or more aspects of the spur cancelation circuitry described herein according to various aspects. The user equipment device 400, for example, comprises a digital baseband processor 402 that can be coupled to a data store or memory 403, a front end 404 (e.g., an RF front end, an acoustic front end, or the other like front end) and a plurality of antenna ports 407 for connecting to a plurality of antennas $406_1$ to $406_k$ (k being a positive integer). The antennas $406_1$ to $406_k$ can receive and transmit signals to and from one or more wireless devices such as access points, access terminals, wireless ports, routers and so forth, which can operate within a radio access network or other communication network generated via a network device (not shown).

The user equipment 400 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 404 can include a communication platform, which comprises electronic components and associated circuitry that provide for processing, manipulation or shaping of the received or transmitted signals via one or more receivers or transmitters (e.g. transceivers) 408, a mux/demux component 412, and a mod/demod component 414. The front end 404 is coupled to the digital baseband processor 402 and the set of antenna ports 407, in which the set of antennas $406_1$ to $406_k$ can be part of the front end. In one aspect, the user equipment device 400 includes a phase locked loop system 410.

The processor 402 can confer functionality, at least in part, to substantially any electronic component within the mobile communication device 400, in accordance with aspects of the disclosure. As an example, the processor 402 can be configured to execute, at least in part, executable instructions that generate the inverse spur signal as described in FIGS. 1-2. The processor 402 may embody various aspects of the spur frequency estimation circuitry, the processing circuitry, the inverse spur circuitry, the injection circuitry, and so on, of FIGS. 1-2.

The processor 402 is functionally and/or communicatively coupled (e.g., through a memory bus) to memory 403 in order to store or retrieve information necessary to operate and confer functionality, at least in part, to communication platform or front end 404, the phase locked loop system 410 and substantially any other operational aspects of the phase locked loop system 410. As described with reference to FIGS. 1 and 2, the phase locked loop system 410 includes at least one oscillator (e.g., a VCO, DCO or the like) that can be calibrated via core voltage, a coarse tuning value, signal, word or selection process according the various aspects described herein. The phase locked loop system 410 may also include the spur cancelation circuitry 105, 205, of FIGS. 1 and 2.

The processor 402 can operate to enable the mobile communication device 400 to process data (e.g., symbols, bits, or chips) for multiplexing/demultiplexing with the mux/demux component 412, or modulation/demodulation via the mod/demod component 414, such as implementing direct and inverse fast Fourier transforms (e.g., processing circuitry 234 of FIG. 2), selection of modulation rates, selection of data packet formats, inter-packet times, etc.

Memory 403 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a frequency generation system, including a spur frequency estimation circuitry configured to receive a phase locked loop (PLL) signal from a PLL and determine an estimated spur frequency of a spur in the received PLL signal based on the received PLL signal. The frequency generation system includes an inverse spur circuitry configured to cancel the spur in the received PLL signal based on the estimated spur frequency.

Example 2 includes the subject matter of example 1, including or excluding any optional elements, wherein the received PLL signal includes a phase error signal generated by a phase detector of the PLL.

Example 2 includes the subject matter of example 2, including or excluding any optional elements, wherein the spur frequency estimation circuitry includes a processing circuitry configured to: analyze a Fourier transform (FT) of the received PLL signal; determine a frequency at which the FT of the received PLL signal exceeds a threshold; and determine the estimated spur frequency as the frequency at which the FT of the received PLL signal exceeds the threshold.

Example 4 includes the subject matter of example 1, including or excluding any optional elements, wherein the spur frequency estimation circuitry includes a processing circuitry configured to apply a parametric algorithm to determine the estimated spur frequency.

Example 5 includes the subject matter of example 1, including or excluding any optional elements, wherein the received PLL signal is a digital signal.

Example 6 includes the subject matter of examples 1-5, including or excluding any optional elements, wherein the inverse spur circuitry is configured to generate an inverse spur signal based on the estimated spur frequency; and the frequency generation system includes an injection circuitry configured to inject the inverse spur signal into the PLL to cancel the spur in the PLL signal.

Example 7 includes the subject matter of example 6, including or excluding any optional elements, wherein the injection circuitry is configured to select either a first inverse spur signal path or a second inverse spur signal path based on a selection input, wherein the injection circuitry includes a first adder element connected to the first inverse spur signal path and disposed at an input to a phase detector in the PLL; and a second adder element connected to the second inverse spur signal path and disposed at an output of a lowpass filter of the PLL.

Example 8 is a method configured to cancel spurs in a phase locked loop (PLL) system, including receiving a PLL signal from the PLL system; determining an estimated spur frequency of a spur in the received PLL signal based on the received PLL signal; and canceling the spur in the received PLL signal based on the estimated spur frequency.

Example 9 includes the subject matter of example 8, including or excluding any optional elements, wherein the receiving includes receiving a phase error signal generated by a phase detector of the PLL.

Example 10 includes the subject matter of example 8, including or excluding any optional elements, wherein the determining includes analyzing a Fourier transform (FT) of the received PLL signal; determining a frequency at which the FT of the received PLL signal exceeds a threshold; and determining the estimated spur frequency as the frequency at which the FT of the received PLL signal exceeds the threshold.

Example 11 includes the subject matter of example 10, including or excluding any optional elements, including utilizing a parametric algorithm to determine the estimated spur frequency.

Example 12 includes the subject matter of example 8, including or excluding any optional elements, wherein the received PLL signal is a digital signal.

Example 13 includes the subject matter of examples 8-12, including or excluding any optional elements, further including generating an inverse spur signal based on the estimated spur frequency; and injecting the inverse spur signal into the PLL to cancel the spur in the PLL signal.

Example 14 includes the subject matter of example 13, including or excluding any optional elements, including selecting either a first inverse spur signal path or a second inverse spur signal path based on a selection input; and when the first inverse spur signal path is selected, injecting the inverse spur signal at an input to a phase detector of the PLL; and when the second inverse spur signal path is selected, injecting the inverse spur signal at an output of a lowpass filter of the PLL.

Example 15 is a spur frequency estimation circuitry, including an input circuitry configured to receive a phase locked loop (PLL) signal from a PLL; and a processing circuitry configured to determine an estimated spur frequency of a spur in the received PLL signal based on the received PLL signal.

Example 16 includes the subject matter of example 15, including or excluding any optional elements, wherein the received PLL signal includes a phase error signal generated by a phase detector of the PLL.

Example 17 includes the subject matter of examples 15-16, including or excluding any optional elements, wherein the processing circuitry is configured to analyze a Fourier transform (FT) of the received PLL signal; determine a frequency at which the FT of the received PLL signal exceeds a threshold; and determine the estimated spur frequency as the frequency at which the FT of the received PLL signal exceeds the threshold.

Example 18 includes the subject matter of examples 15-16, including or excluding any optional elements, wherein the processing circuitry is configured to apply a parametric algorithm to determine the estimated spur frequency.

Example 19 is a computer-readable storage device storing computer-executable instructions that, in response to execution by a processor, cause the processor to cancel spurs in a phase locked loop (PLL) system. The instructions include instructions for receiving a PLL signal from the PLL system; determining an estimated spur frequency of a spur in the received PLL signal based on the received PLL signal; and canceling the spur in the received PLL signal based on the estimated spur frequency.

Example 20 includes the subject matter of example 19, including or excluding any optional elements, wherein the instructions for receiving include instructions for receiving a phase error signal generated by a phase detector of the PLL.

Example 21 includes the subject matter of examples 19-20, including or excluding any optional elements, wherein the instructions for determining include instructions for analyzing a Fourier transform (FT) of the received PLL signal; determining a frequency at which the FT of the received PLL signal exceeds a threshold; and determining the estimated spur frequency as the frequency at which the FT of the received PLL signal exceeds the threshold.

Example 22 includes the subject matter of examples 19-20, including or excluding any optional elements, wherein the instructions for determining include instructions for utilizing a parametric algorithm to determine the estimated spur frequency.

Example 23 is an apparatus configured to cancel spurs in a phase locked loop (PLL) system, including means for receiving a PLL signal from the PLL system; means for determining an estimated spur frequency of a spur in the received PLL signal based on the received PLL signal; and means for canceling the spur in the received PLL signal based on the estimated spur frequency.

Example 24 includes the subject matter of example 23, including or excluding any optional elements, wherein the means for receiving is configured to receive a phase error signal generated by a phase detector of the PLL.

Example 25 includes the subject matter of examples 23-24, including or excluding any optional elements, wherein the means for determining includes means for analyzing a Fourier transform (FT) of the received PLL signal; means for determining a frequency at which the FT of the received PLL signal exceeds a threshold; and means for determining the estimated spur frequency as the frequency at which the FT of the received PLL signal exceeds the threshold.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

The invention claimed is:

1. A frequency generation system, comprising:
a spur frequency estimation circuitry configured to:
receive a phase locked loop (PLL) signal from a PLL;
determine an estimated spur frequency of a spur in the received PLL signal based on the received PLL signal; and
an inverse spur circuitry configured to cancel the spur in the received PLL signal based on the estimated spur frequency.

2. The frequency generation system of claim 1, wherein the received PLL signal comprises a phase error signal generated by a phase detector of the PLL.

3. The frequency generation system of claim 1, wherein the spur frequency estimation circuitry comprises a processing circuitry configured to:
analyze a Fourier transform (FT) of the received PLL signal;
determine a frequency at which the FT of the received PLL signal exceeds a threshold; and
determine the estimated spur frequency as the frequency at which the FT of the received PLL signal exceeds the threshold.

4. The frequency generation system of claim 1, wherein the spur frequency estimation circuitry comprises a processing circuitry configured to apply a parametric algorithm to determine the estimated spur frequency.

5. The frequency generation system of claim 1, wherein the received PLL signal is a digital signal.

6. The frequency generation system of claim 1, wherein:
the inverse spur circuitry is configured to generate an inverse spur signal based on the estimated spur frequency; and
the frequency generation system comprises an injection circuitry configured to inject the inverse spur signal into the PLL to cancel the spur in the PLL signal.

7. The frequency generation system of claim 6, wherein the injection circuitry is configured to select a first inverse spur signal path or a second inverse spur signal path based on a selection input, wherein the injection circuitry comprises:
a first adder element connected to the first inverse spur signal path and disposed at an input to a phase detector of the PLL; and
a second adder element connected to the second inverse spur signal path and disposed at an output of a lowpass filter of the PLL.

8. A method configured to cancel spurs in a phase locked loop (PLL) system, comprising:
receiving a PLL signal from the PLL system;
determining an estimated spur frequency of a spur in the received PLL signal based on the received PLL signal; and
canceling the spur in the received PLL signal based on the estimated spur frequency.

9. The method of claim 8, wherein the receiving comprises receiving a phase error signal generated by a phase detector of the PLL.

10. The method of claim 8, wherein the determining comprises:
analyzing a Fourier transform (FT) of the received PLL signal;
determining a frequency at which the FT of the received PLL signal exceeds a threshold; and
determining the estimated spur frequency as the frequency at which the FT of the received PLL signal exceeds the threshold.

11. The method of claim 10, comprising utilizing a parametric algorithm to determine the estimated spur frequency.

12. The method of claim 8, wherein the received PLL signal is a digital signal.

13. The method of claim 8, further comprising:
generating an inverse spur signal based on the estimated spur frequency; and
injecting the inverse spur signal into the PLL to cancel the spur in the PLL signal.

14. The method of claim 13, comprising:
selecting a first inverse spur signal path or a second inverse spur signal path based on a selection input; and
if the first inverse spur signal path is selected, injecting the inverse spur signal at an input to a phase detector of the PLL; and
if the second inverse spur signal path is selected, injecting the inverse spur signal at an output of a lowpass filter of the PLL.

15. A spur frequency estimation circuitry, comprising:
an input circuitry configured to receive a phase locked loop (PLL) signal from a PLL; and
a processing circuitry configured to determine an estimated spur frequency of a spur in the received PLL signal based on the received PLL signal.

16. The spur frequency estimation circuitry of claim 15, wherein the received PLL signal comprises a phase error signal generated by a phase detector of the PLL.

17. The spur frequency estimation circuitry of claim 15, wherein the processing circuitry is configured to:

analyze a Fourier transform (FT) of the received PLL signal;

determine a frequency at which the FT of the received PLL signal exceeds a threshold; and determine the estimated spur frequency as the frequency at which the FT of the received PLL signal exceeds the threshold.

18. The spur frequency estimation circuitry of claim 15, wherein the processing circuitry is configured to apply a parametric algorithm to determine the estimated spur frequency.

19. A computer-readable storage device storing computer-executable instructions that, in response to execution by a processor, cause the processor to cancel spurs in a phase locked loop (PLL) system, wherein the instructions include instructions for:

receiving a PLL signal from the PLL system;

determining an estimated spur frequency of a spur in the received PLL signal based on the received PLL signal; and canceling the spur in the received PLL signal based on the estimated spur frequency.

20. The computer-readable storage device of claim 19, wherein the instructions for receiving comprise instructions for receiving a phase error signal generated by a phase detector of the PLL.

21. The computer-readable storage device of claim 19, wherein the instructions for determining comprise instructions for:

analyzing a Fourier transform (FT) of the received PLL signal;

determining a frequency at which the FT of the received PLL signal exceeds a threshold; and determining the estimated spur frequency as the frequency at which the FT of the received PLL signal exceeds the threshold.

22. The computer-readable storage device of claim 19, wherein the instructions for determining comprise instructions for utilizing a parametric algorithm to determine the estimated spur frequency.

* * * * *